(12) United States Patent
Tsai et al.

(10) Patent No.: US 9,252,060 B2
(45) Date of Patent: Feb. 2, 2016

(54) REDUCTION OF OCD MEASUREMENT NOISE BY WAY OF METAL VIA SLOTS

(75) Inventors: Chi-Ming Tsai, New Taipei (TW);
Liang-Guang Chen, Hsinchu (TW);
Han-Hsin Kuo, Tainan (TW); Fu-Ming Huang, Changhua County (TW);
Hao-Jen Liao, Taichung (TW);
Ming-Chung Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 13/436,952

(22) Filed: Apr. 1, 2012

(65) Prior Publication Data
US 2013/0256659 A1    Oct. 3, 2013

(51) Int. Cl.
*H01L 23/58* (2006.01)
*H01L 21/66* (2006.01)
*H01L 23/522* (2006.01)
*H01L 21/768* (2006.01)

(52) U.S. Cl.
CPC .............. *H01L 22/12* (2013.01); *H01L 22/30* (2013.01); *H01L 21/7684* (2013.01); *H01L 23/522* (2013.01); *H01L 2924/0002* (2013.01)

(58) Field of Classification Search
USPC ........................................................ 438/598
See application file for complete search history.

(56) References Cited

U.S. PATENT DOCUMENTS

| 2009/0321871 A1* | 12/2009 | Weng et al. .................. 257/503 |
| 2010/0281981 A1* | 11/2010 | Tas et al. .......................... 73/570 |
| 2010/0314711 A1* | 12/2010 | Farooq et al. ................. 257/506 |
| 2010/0321671 A1* | 12/2010 | Marx et al. ...................... 356/51 |

* cited by examiner

*Primary Examiner* — Fernando L Toledo
*Assistant Examiner* — Valerie N Newton
(74) *Attorney, Agent, or Firm* — Haynes and Boone, LLP (57) ABSTRACT

The present disclosure provides a semiconductor device. The semiconductor device includes a substrate and an interconnect structure disposed over the substrate. The interconnect structure includes a plurality of interconnect layers. One of the interconnect layers contains: a plurality of metal via slots and a bulk metal component disposed over the plurality of metal via slots. The present disclosure also provides a method. The method includes providing a wafer, and forming a first layer over the wafer. The method includes forming an interconnect structure over the first layer. The forming the interconnect structure includes forming a second interconnect layer over the first layer, and forming a third interconnect layer over the second interconnect layer. The second interconnect layer is formed to contain a plurality of metal via slots and a bulk metal component formed over the plurality of metal via slots. The third interconnect layer contains one or more metal trenches.

20 Claims, 6 Drawing Sheets

REDUCTION OF OCD MEASUREMENT NOISE BY WAY OF METAL VIA SLOTS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

During the fabrication of an IC, optical critical dimension (OCD) measurements may be made. OCD measurements may involve projecting a light beam to the wafer and performing the measurement based on the reflected light. For example, in a dual damascene process, after the metal trenches are formed and are being polished (for example in a chemical-mechanical-polishing process), it may be desirable to monitor the thickness of the trench being polished. This may be done to ensure that the metal trenches are not over-polished or under-polished. To accurately monitor the trench thickness, a light beam is projected to the layer in which the metal trenches are formed, and its reflection is measured. However, the accuracy of such measurements requires that the projected light does not penetrate to layers below the metal trenches. Otherwise, the reflected light may carry noise from the under-layers, thereby degrading OCD measurement accuracy.

As the scaling down process continues, it is increasingly more difficult to prevent the light from over penetration and/or to block the noise from the under layers. Therefore, while existing methods and structures of performing OCD measurement have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
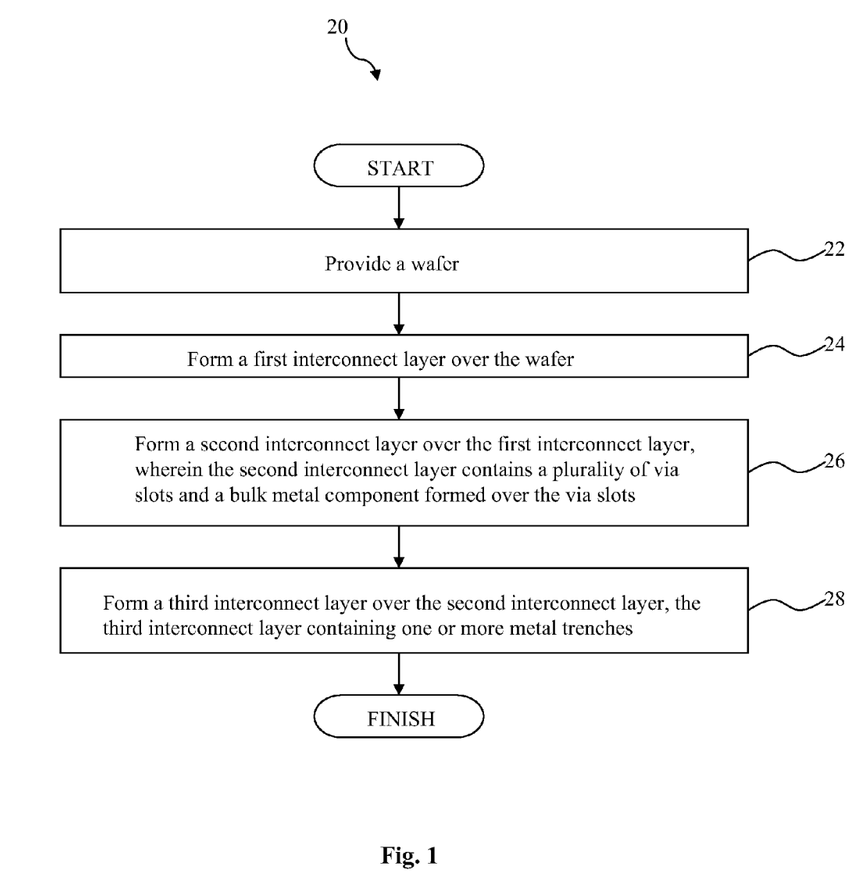
FIG. 1 is a flowchart illustrating a method of fabricating a semiconductor device according to various aspects of the present disclosure.

FIG. 1 is a flowchart of a method 20 for fabricating a semiconductor device. The method 20 includes a block 22 in which a wafer is provided. A horizontal surface of the wafer on which the interconnect structure is formed is defined by a first horizontal direction and a second horizontal direction. The method 20 includes a block 24 in which a first interconnect layer of an interconnect structure is formed over the wafer. In some embodiments, the first interconnect layer includes a plurality of dummy patterns or dummy structures. It is also understood that the "first interconnect layer" need not actually be an interconnect layer. For example, in some alternative embodiments, the "first interconnect layer" may be any other layer of a semiconductor device, or even the substrate itself. The "first interconnect layer" of an interconnect structure is used herein simply to provide an example of the present disclosure.

The method 20 includes a block 26 in which a second interconnect layer of the interconnect structure is formed over the first interconnect layer. Once again, it is understood that in embodiments where the "first interconnect layer" described above is not actually an interconnect layer of an interconnect structure, the "second interconnect layer" may be any interconnect layer of the interconnect structure, for example a bottom-most interconnect layer. In some embodiments, the interconnect structure includes a plurality of metal via slots and a bulk metal component formed over the metal via slots. Each metal via slot has a first dimension defined in the first horizontal direction and a second dimension defined in the second horizontal direction, and the bulk metal component has a third dimension defined in the first horizontal direction and a fourth dimension defined in the second horizontal direction. In some embodiments, the first dimension is at least a plurality of times greater than the second dimension, and the fourth dimension is at least a plurality of times greater than the second dimension.

The method 20 includes a block 28 in which a third interconnect layer is formed over the second interconnect layer. In some embodiments, the third interconnect layer includes a plurality of metal trenches. In some embodiments, a trench depth of the metal trenches is measured at least in part by projecting a light on the wafer. In some embodiments, the via slots and the bulk metal component are formed as a part of a test interconnect structure. The test interconnect structure may be located in a scribe-line region of the wafer.

Figure 2:
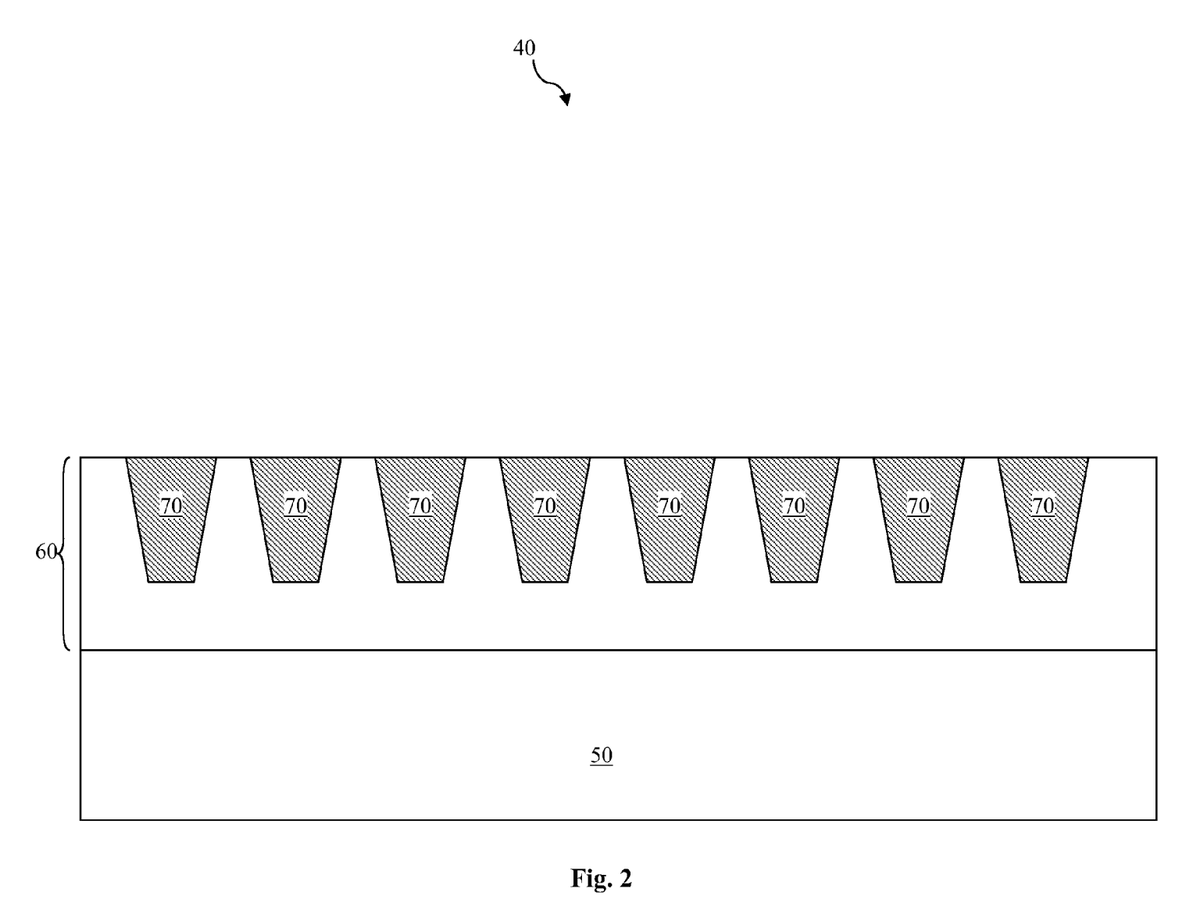
FIGS. 2-4 are diagrammatic fragmentary cross-sectional side views of a semiconductor device at various stages of fabrication in accordance with various aspects of the present disclosure.
Figure 3:
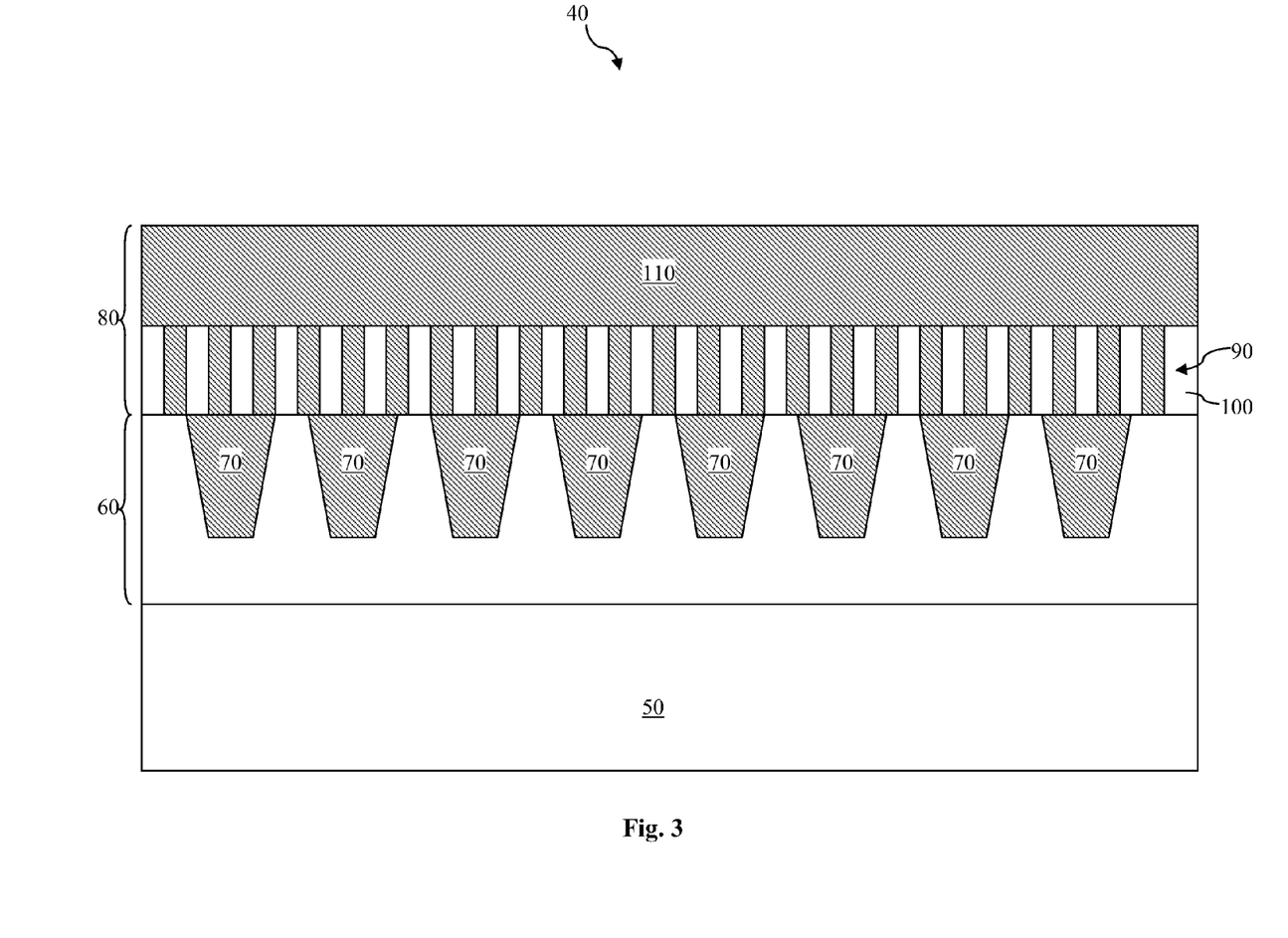
Figure 4:
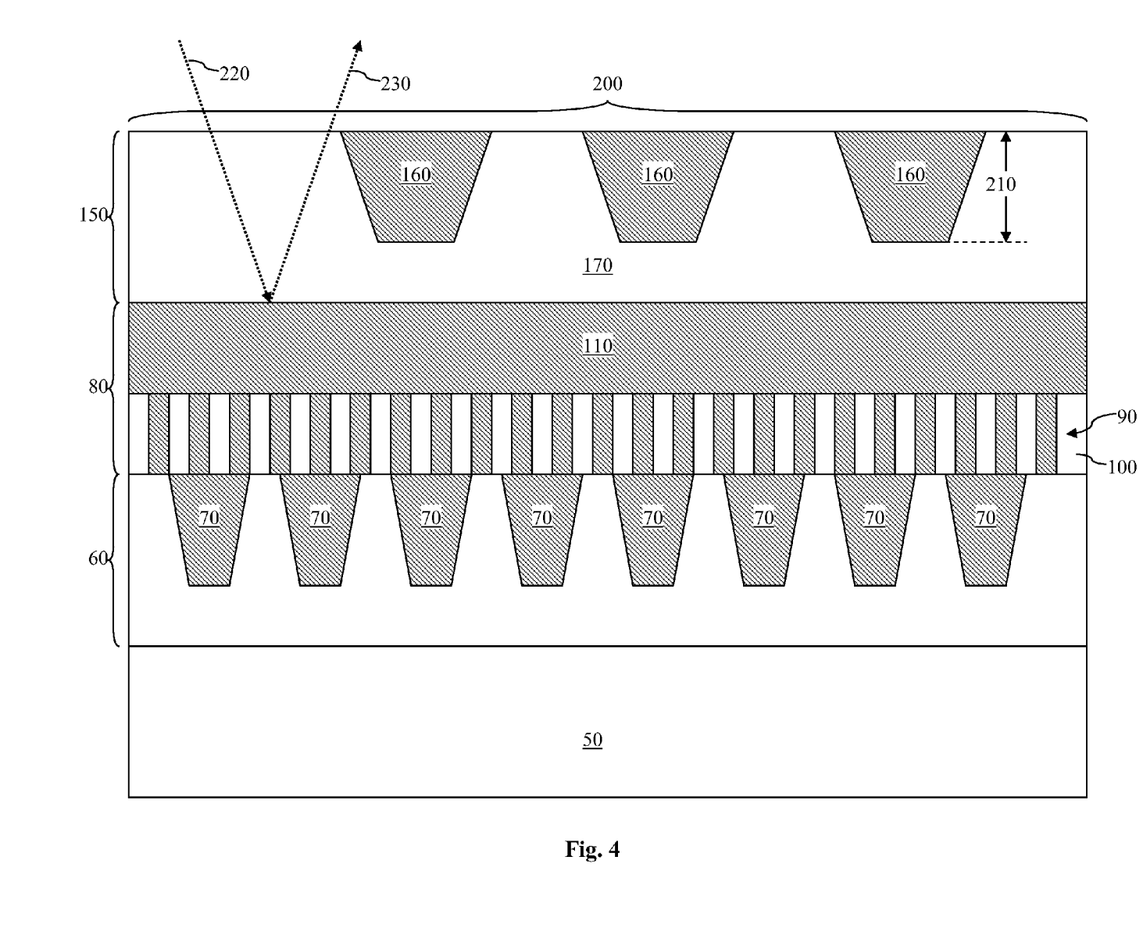

FIGS. 2-4 are diagrammatic fragmentary cross-sectional side views of a semiconductor device 40 at various stages of fabrication in accordance with various aspects of the present disclosure. It is understood that FIGS. 2-4 have been simplified for a better understanding of the inventive concepts of the present disclosure. Accordingly, it should be noted that additional processes may be provided before, during, and after the processes shown in FIGS. 2-4, and that some other processes may only be briefly described herein.

Referring to FIG. 2, the semiconductor device 40 may be a portion of a semiconductor wafer. The semiconductor device 40 includes a substrate 50, a portion of which is shown in FIG. 2. In the embodiment shown, the substrate 50 is a silicon substrate that is doped with a P-type dopant such as boron. In another embodiment, the substrate 50 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 50 could include an epitaxial layer (epi layer), may be strained for performance enhancement, and may include a silicon-on-insulator (SOI) structure.

Isolation structures may be formed in the substrate 50. In some embodiments, the isolation structures include shallow trench isolation (STI) devices. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 50 and thereafter filling the trenches with the dielectric material. In other embodiments, deep trench isolation (DTI) devices may also be formed in place of (or in combination with) the STI devices as the isolation structures. For reasons of simplicity, the isolation structures are not specifically herein.

A plurality of microelectronic components is also formed in the substrate. For example, source and drain regions of FET transistor devices may be formed in the substrate 50 by one or more ion implantation and/or diffusion processes. As another example, radiation-sensitive image pixels may be formed in the substrate 50. For reasons of simplicity, these microelectronic components are not specifically illustrated herein either.

A layer 60 is formed over the substrate 50. In some embodiments, the layer 60 is an interconnect layer of an interconnect structure, which is used herein purely for the sake of providing an example. It is understood that in other embodiments, the layer 60 may be any other layer of a semiconductor device, or even a portion of the substrate 50 itself.

Still referring to FIG. 4, the interconnect layer 60 contains a plurality of devices 70. In some embodiments, these devices are dummy devices, for example, dummy metal lines. The dummy metal lines may contain aluminum or copper, or may contain other conductive materials such as aluminum alloy, copper alloy, aluminum/silicon/copper alloy, titanium, titanium nitride, tantalum, tantalum nitride, tungsten, polysilicon, metal silicide, or combinations thereof. The dummy metal lines may be formed by a process including physical vapor deposition (PVD), chemical vapor deposition (CVD), sputtering, plating, or combinations thereof. In various embodiments, the devices 70 may include interconnect layer circuitry, dummy structures, other suitable circuit devices, or portions of the substrate, etc. The devices 70 are separated from one another by a dielectric material, for example a low-k dielectric material.

Referring now to FIG. 3, an interconnect layer 80 is formed over the interconnect layer 60. The interconnect layer 80 contains a plurality of via slots (or slot vias) 90. The via slots 90 are separated from one another by a dielectric material 100, for example a low-k dielectric material or an oxide material. The interconnect layer 80 also contains a bulk metal component 110 that is formed over the plurality of via slots 90. In some embodiments, the via slots 90 and the bulk metal component 110 each contain copper or a copper alloy. In other embodiments, the via slots and the bulk metal component 110 each contain aluminum or aluminum alloy. In some embodiments, the via slots and the bulk metal component 110 may contain aluminum/silicon/copper alloy, titanium, titanium nitride, tantalum, tantalum nitride, tungsten, polysilicon, or metal silicide, In some embodiments, the bulk metal component 110 and the via slots 90 are formed by a dual damascene process, which involves forming an opening in the interconnect layer 80, filling the opening with a metal material, followed by a polishing process. In more detail, a plurality of photolithography processes (which may include one or more spin coating, exposing, baking, developing, and etching processes, though not necessarily in that order) may be performed to define the opening in the dielectric material 100. The opening has a plurality of lower portion segments and an upper portion segment. The lower portion segments of the opening are shaped narrow and are reserved for the formation of the via slots 90, whereas the upper portion segment of the opening is shaped substantially wider than the lower portion segments and is reserved for the formation of the bulk metal component 110. Thereafter, a metal deposition process is performed to fill both the lower portion segments and the upper portion segment of the opening. A polishing process such as a chemical-mechanical-polishing (CMP) process may then performed to remove additional metal materials outside the opening, thereby forming the via slots 90 and the bulk metal component 110. As such, the via slots 90 and the bulk metal components 110 are interconnected.

Referring now to FIG. 4, an interconnect layer 150 is formed over the interconnect layer 80. The interconnect layer 150 contains one or more devices 160. In some embodiments, the devices 160 are metal lines (or metal trenches). The metal lines or metal trenches 160 may contain aluminum or copper, or may contain other conductive materials such as aluminum alloy, copper alloy, aluminum/silicon/copper alloy, titanium, titanium nitride, tantalum, tantalum nitride, tungsten, polysilicon, metal silicide, or combinations thereof. The metal lines or metal trenches 160 may be formed by a process including PVD, CVD, sputtering, plating, or combinations thereof. The metal lines or trenches 160 are separated from one another by a dielectric material 170, for example a low-k dielectric material or an oxide material.

It is understood that although only three interconnect layers 60, 80, and 150 are illustrated herein, a number of other interconnect layers may be formed below the interconnect layer 60 or above the interconnect layer 150. These interconnect layers collectively constitute an interconnect structure. Through these interconnect layers, the interconnect structure can provide interconnections (e.g., wiring) between circuitries, inputs/outputs, and various doped features formed in the substrate 50.

It is noted that the portions of the interconnect structure illustrated herein is actually a test structure 200. In more detail, the portions of the interconnect layers 60, 80, and 150 of the test structure 200 illustrated herein are not formed to provide interconnections for the various features/components in the substrate 50. Rather, they are formed to facilitate the fabrication monitoring of the rest of the (functional) interconnect structure.

For example, as discussed above, a dual damascene process may be used to form metal lines or trenches, which may involve performing a polishing process such as a CMP process. To ensure that the polishing is not overdone or underdone, it is desirable to measure the thickness of the metal trench. Here, the metal trenches 160 are formed at the same time that the other metal trenches of the functional interconnect structure. In other words, the metal trenches 160 of the test structure 200 are formed using the same fabrication process as the rest of the metal trenches in the same interconnect layer. This means that, as the polishing process is being performed, the metal trenches 160 will be polished in approximately the same manner as the functional metal trenches located elsewhere on the wafer. A measurement of a trench depth 210 of the metal trenches 160 will give an indication of the trench depth of the functional metal trenches elsewhere on the wafer.

To measure the trench depth 210, an incident light 220 is projected on the test structure 200. The via slots 90 and the bulk metal component 110 of the interconnect layer 80 function as a reflective and blocking layer to reflect the incident light 220 as a reflected light 230. Based on the incident light 220 and the reflected light 230, the trench depth 210 of the metal trenches 160 can be accurately measured.

However, the measurement accuracy of the trench depth 210 may be degraded if a portion of the incident light 220 transmits through the interconnect layer 80 and is then reflected. In that case, the reflected light may contain measurement noise contributed by the under-layers, such the interconnect layer 60. Stated differently, if the interconnect layer 80 is not able to substantially accomplish total reflection of the incident light 220, it may be difficult to obtain an accurate measurement of the trench depth 210 of the metal trenches 210. This is a problem in conventional semiconductor fabrication, which may only use a single bulk metal layer as a reflective/blocking layer for the incident light. The traditional light blocking layer lacks the via slots. As semiconductor devices continue to get scaled down, the single bulk metal layer becomes thinner and thinner, thereby rendering it ineffective at preventing the penetration of light at some point. Hence, the scaling down process may lead to degraded metal trench depth measurement accuracy for traditional devices, since they cannot prevent the undesirable light penetration into the under-layers.

In comparison, the embodiments of the present disclosure overcome the problem discussed above, since the interconnect layer 80—being used as a light reflection/light blocking layer—contains not only a bulk metal component 110, but also the via slots 90. The via slots 90 further prevent the penetration of the light into the under-layers and thereby enhance the reflection of the incident light 220. Consequently, almost all of the incident light 220 can be reflected as the reflected light 230 without any noise contributions from the under-layers, and thus the trench depth 210 of the metal trenches 160 can be accurately measured.

Figure 5:
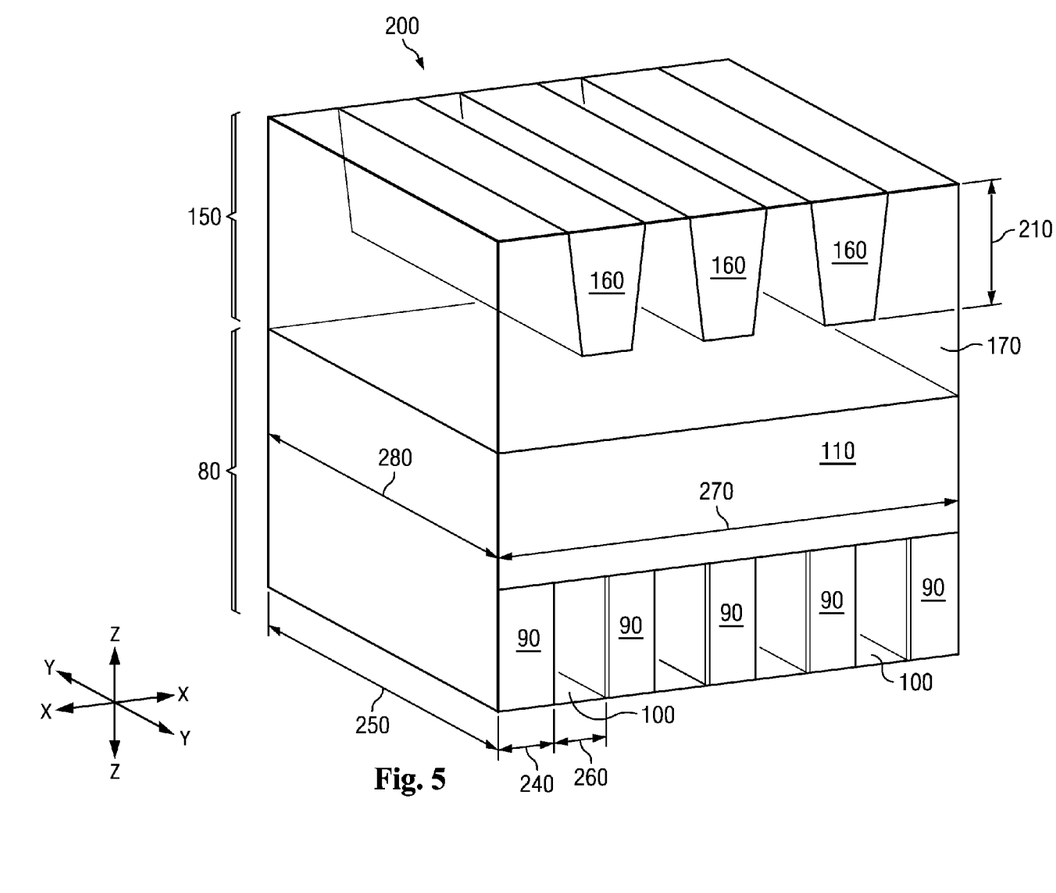
FIG. 5 is a diagrammatic fragmentary perspective three-dimensional view of a semiconductor device at a stage of fabrication in accordance with various aspects of the present disclosure.

FIG. 5 shows a simplified diagrammatic fragmentary perspective three-dimensional view of a portion of the test structure 200 discussed above with reference to FIG. 4. Specifically, the interconnect layers 80 and 150 of the test structure 200 are shown in FIG. 5. The interconnect layer 80 contains the plurality of via slots 90 separated by the dielectric material 100. The interconnect layer 80 also contains the bulk metal component 110 located above the via slots 90. The interconnect layer 150 contains the metal trenches 160 whose trench depths 210 need to be measured. The metal trenches 160 are surrounded by the dielectric material 170.

The three-dimensional view of FIG. 5 is defined by three orthogonal axes X, Y, and Z. The X axis and the Y axis are each referred to as a horizontal axis, while the Z axis is referred to as a vertical axis. The cross-sectional views of FIGS. 2-4 are taken by cutting the test structure 200 along the X and Z axes. A top view of the test structure 200 can be obtained by cutting the test structure 200 along the X and Y axes.

Although not necessarily illustrated for reasons of simplicity, it is understood that the via slots 90 may be horizontal or orthogonal with the metal trenches 160. Each via slot 90 has a dimension 240 that is defined (or measured) along the X axis, as well as a dimension 250 that is defined along the Y axis. The dimension 250 is substantially greater than the dimension 240. For example, the dimensional 250 may be at least multiple times greater than the dimension 240. In some embodiments, the dimension 240 is in a range from about 0.1 um to about 10 um, and the dimension 250 is in a range from about 10 um to about 100 um. In a sense, the via slot 250 is akin to an elongate rectangular metal "wall," since it extends substantially in a direction defined by the Y axis. As such, it can effectively block light penetration and reflect incoming light.

The fact that the dimension 250 is substantially greater than the dimension 240 for the via slot 90 also differentiates the via slot 90 from "conventional" vias (not illustrated herein). For conventional vias, the primary purpose is for it to interconnect the devices above and below, for example interconnecting together two metal lines from different metal layers. Thus, such conventional vias usually have two horizontal dimensions (i.e., one defined by the X axis and the other defined by the Y axis) that are not too different from one another. For example, the X axis dimension and the Y axis dimension may be substantially equal, or may vary within percentage points from one another. Also, conventional vias may have other shapes such as circular or oval shapes from a top view. Despite their differences, however, it is understood that the via slots 90 may be fabricated in the same fabrication stage using the same fabrication processes as the conventional vias in the same interconnect layer. The shape and size differences between the via slots 90 and the conventional vias may be achieved through tweaking the lithography processes, for example changing mask patterns.

The dielectric material 100 separating the adjacent via slots 90 also each have a dimension 260 defined (or measured) along the X axis. A via slot density may be defined by a ratio between the dimension 240 of the via slot 90 and the dimension 260 of the dielectric material located adjacent thereto. In other words, the via slot density=(dimension 240)/[(dimension 260)+(dimension 240)]. The via slot density may alternatively be viewed as the collective size of the via slots 90 versus the collective size of the dielectric material 100. The via slot density may be tuned by tweaking the lithography process as well. In some embodiments, the via slot density is in a range from about 50% (i.e., the dimensions 240 and 260 are equal to each other) to about 100% (i.e., the via slots 90 substantially occupy all of the lower segment portions of the interconnect layer 80, leaving substantially almost no room for the dielectric material 100).

The bulk metal component 110 has a dimension 270 that is defined (or measured) along the X axis, as well as a dimension 280 that is defined along the Y axis. The dimension 270 of the bulk metal component 110 is substantially greater than the dimension 240 of each via slot 90. For example, the dimensional 270 may be at least multiple times greater than the dimension 240. In some embodiments, the dimension 270 is in a range from about 20 um to about 100 um. In other words, the bulk metal component 110 is large enough to be situated on a plurality of via slots 90, as is illustrated in FIG. 5. Meanwhile, the dimension 280 of the bulk metal component 110 is not too different from the dimension 250 of the via slot 90. In some embodiments, the dimensions 280 and 250 may be approximately equal to one another. In other embodiments, the dimensions 280 and 250 may vary within percentage points of one another.

As discussed above, a light (not illustrated herein) may be projected toward the test structure 200, and its reflection may be measured to calculate the trench depth 210 of the metal trenches 160 in the interconnect layer 150. To obtain an accurate result, it is desirable to substantially prevent the light from penetrating through the interconnect layer 80. Though the bulk metal component 110 by itself may be insufficient to achieve the total reflection of the projected light, the via slots 90 located therebelow can also help reflect the light and prevent the light penetration to the under-layers. Therefore, the combination of the bulk metal component 110 and the via slots 90 collectively may cause substantially all of the light to be reflected, thereby allowing the trench depth 210 to be accurately measured.

It is understood that although the discussions above use the measurement of metal trench depth following a CMP process as an example of obtaining an accurate measurement result, the method and structure of the present disclosure may be used in other optical critical dimension (OCD) measurement processes as well. For example, an OCD process in some embodiments may involve a deposition process or an etching process. These processes and their corresponding measurements may involve projecting a light on a wafer and using its reflection to calculate the measurement results. Since total light reflection is still desirable in these other cases of OCD measurements, the test structure 200 illustrated herein (or a similar structure) may still be employed to perform the light reflection functions. In other words, the test structure may still use a bulk metal component and a plurality of via slots disposed underneath to substantially reflect all of the incident light.

Figure 6:
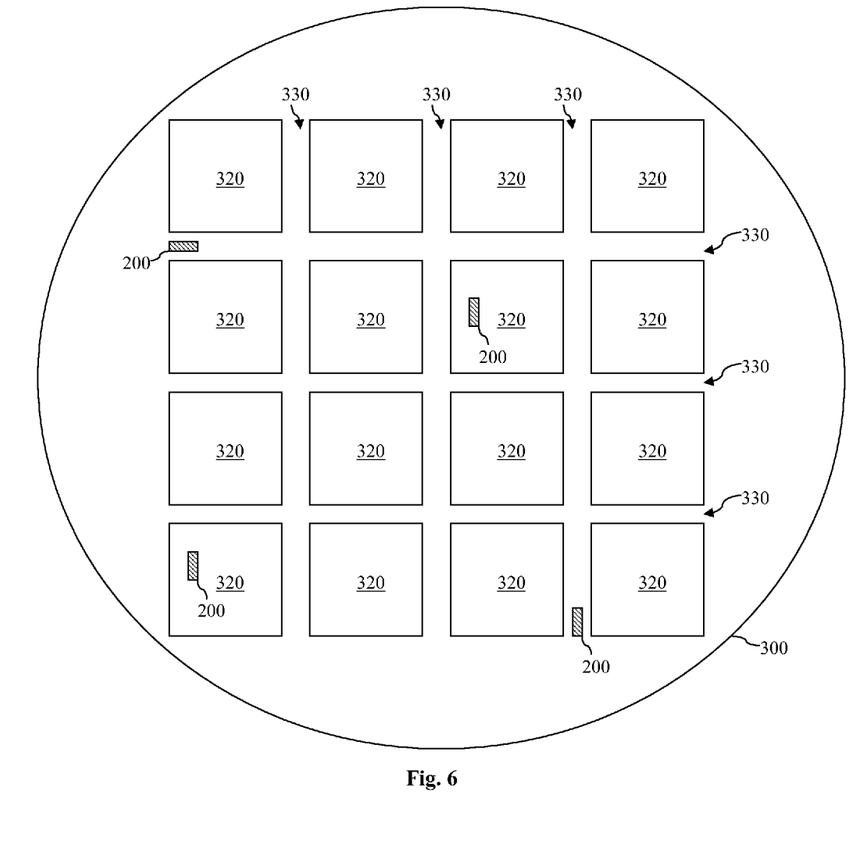
FIG. 6 is a diagrammatic fragmentary top view of a semiconductor device at a stage of fabrication in accordance with various aspects of the present disclosure.

FIG. 6 is a simplified diagrammatic top view of a portion of an example wafer 300 on which the test structure 200 discussed above may be implemented. The portion of the wafer 300 contains a plurality of Integrated Circuit (IC) chips 320, which have not been packaged yet. These IC chips may include memory circuits, logic circuits, high frequency circuits, image sensors, etc. The various devices formed on the chip may include passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors.

The IC chips 320 are separated by scribe lines 330 (or scribe line regions). In some embodiments, the scribe lines 330 will be where the slicing of the wafer 300 takes place, so that the IC chips 320 may be packaged. According to various aspects of the present disclosure, one or more of the test structures 200 may be implemented in some of the scribe line regions 330. The test structures 200 may be fabricated along with the rest of the interconnect structures for the IC chips 320. As discussed above, since the fabrication process steps are the same for the test structures 200 in the scribe-line regions 330 and the other devices in the interconnect structure, the test structures 200 may be used to monitor the characteristics or performance of the other devices in the interconnect structure. For example, as discussed above, a trench depth of metal trenches in the interconnect structure of the IC chips 320 may be monitored or obtained by measuring the trench depth of the metal trenches formed in the test structure 200. It is also understood that in some embodiments, the test structures 200 may be implemented in certain regions inside one or more of the IC chips 320 as well. This aspect of the test structure 200 implementation is also illustrated in FIG. 6.

As discussed above, the embodiments of the present disclosure offers advantages, it being understood that different embodiments may offer different advantages, and not all the advantages are discussed herein, and that no particular advantage is required for all embodiments. One of the other advantages of certain embodiments of the present disclosure is that, by implementing the via slots below the bulk metal component, a very good light blocking structure can be formed in the interconnect layer. As such, light penetration to the under-layers is substantially eliminated, as is the accompanying measurement noise from the under-layers. Therefore, the OCD measurement results can be accurate even as the device scaling down process continues.

Another advantage of the embodiments of the present disclosure is that it is cost-effective to implement. Specifically, since the test structure containing the bulk metal layer and the via slots are formed along with the rest of the interconnect structure located elsewhere on the wafer, no additional processing steps are needed. Therefore, the methods and structure discussed herein are compatible with existing process flow and reduces fabrication costs.

One of the broader forms of the present disclosure involves a semiconductor device. The semiconductor device includes: a substrate; and an interconnect structure disposed over the substrate; wherein: the interconnect structure includes a plurality of interconnect layers; and one of the interconnect layers contains: a plurality of metal via slots; and a bulk metal component disposed over the plurality of metal via slots.

In some embodiments, each metal via slot has a first horizontal dimension measured along a first axis and a second horizontal dimension measured along a second axis different from the first axis; and the first dimension is substantially greater than the second dimension.

In some embodiments, the first axis is perpendicular to the second axis; and the first dimension is multiple times greater than the second dimension.

In some embodiments, the bulk metal component has a third horizontal dimension measured along the first axis and a fourth horizontal dimension measured along the second axis; the third dimension is within a few percentage points from the first dimension; and the fourth dimension is multiple times greater than the second dimension.

In some embodiments, the metal via slots have a slot density in a range from about 50% to about 100%.

In some embodiments, adjacent metal via slots are separated by dielectric materials, and wherein the slot density is defined by a ratio of: a horizontal dimension of one of the metal via slots to a horizontal dimension of the dielectric material disposed adjacent thereto.

In some embodiments, the interconnect structure is a test structure.

In some embodiments, the interconnect structure is implemented over a scribe-line region of the substrate.

In some embodiments, the interconnect layer in which the metal via slots and the bulk metal component are located is disposed between two other interconnect layers.

Another of the broader forms of the present disclosure involves a semiconductor structure. The semiconductor structure includes: a first interconnect layer including a plurality of first devices; a second interconnect layer located over the first interconnect layer, the second interconnect layer including a plurality of elongate via slots and a bulk component located over the plurality of via slots, wherein the via slots and the bulk component each contain a light-reflective material, and wherein each via has a first horizontal dimension and a second horizontal dimension measured in a different direction than the first horizontal dimension and substantially smaller than the first horizontal dimension; and a third interconnect layer located over the second interconnect layer, the third interconnect layer including a plurality of second devices, wherein the second devices include metal trenches.

In some embodiments, the via slots and the bulk component each contain metal and are interconnected together; the first dimension is perpendicular to the second dimension; the second dimension is at least several times smaller than the first dimension; and a dimension of the bulk component measured in the same direction as the second dimension is at least multiple times greater than the second dimension of each of the via slots.

In some embodiments, via slots are separated from adjacent via slots by a dielectric material; and a via slot density being defined by ratio of a size of the via slots and the dielectric material is in a range from about 50% to about 100%.

In some embodiments, the first devices include dummy patterns.

In some embodiments, the semiconductor structure is a test structure; and the first, second, and third interconnect layers are portions of an interconnect structure within the test structure.

In some embodiments, the test structure is located in a scribe-line region of a wafer.

Still another of the broader forms of the present disclosure involves a method of fabricating a semiconductor device. The method includes: providing a wafer; forming a first layer over the wafer; and forming an interconnect structure over the wafer; wherein the forming the interconnect structure includes: forming a second interconnect layer over the first layer, the second interconnect layer containing: a plurality of metal via slots and a bulk metal component formed over the plurality of metal via slots; and forming a third interconnect layer over the second interconnect layer, the third interconnect layer containing one or more metal trenches.

In some embodiments, a horizontal surface of the wafer on which the interconnect structure is formed is defined by a first horizontal direction and a second horizontal direction; each metal via slot has a first dimension defined in the first horizontal direction and a second dimension defined in the second horizontal direction; the bulk metal component has a third dimension defined in the first horizontal direction and a fourth dimension defined in the second horizontal direction; the first dimension is at least a plurality of times greater than the second dimension; and the fourth dimension is at least a plurality of times greater than the second dimension.

In some embodiments, the method further includes performing an optical critical dimension (OCD) measurement process, including projecting a light on the wafer.

In some embodiments, the forming the interconnect structure includes simultaneously forming a test interconnect structure and a functional interconnect structure, and wherein the plurality of via slots and the bulk metal component are portions of the test interconnect structure.

In some embodiments, the test interconnect structure is formed in a scribe-line region of the wafer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising:
a substrate; and
an interconnect structure disposed over the substrate;
wherein:
the interconnect structure includes a plurality of interconnect layers; and
a first one of the interconnect layers contains:
a plurality of metal via slots; and
a bulk metal component disposed over the plurality of metal via slots, wherein the bulk metal component and the plurality of metal via slots are electrically isolated from the substrate, wherein the bulk metal component has a bottom surface facing the plurality of metal via slots and an opposing top surface facing away from the plurality of metal via slots;
a second one of the interconnect layers disposed over the first one of the interconnect layers, wherein the second one of the interconnect layers includes a metal trench disposed directly over the bulk metal component and electrically isolated from the bulk metal component and wherein the metal trench is electrically isolated from the semiconductor substrate, wherein the metal trench has a bottom surface facing the top surface of the bulk metal component; and
a dielectric material layer electrically isolating the metal trench from the bulk metal component, wherein the dielectric material layer extends from the bottom surface of the metal trench to the top surface of the bulk metal component.

2. The semiconductor device of claim 1, wherein:
each metal via slot has a first horizontal dimension measured along a first axis and a second horizontal dimension measured along a second axis different from the first axis; and
the first dimension is substantially greater than the second dimension.

3. The semiconductor device of claim 2, wherein:
the first axis is perpendicular to the second axis; and
the first dimension is multiple times greater than the second dimension.

4. The semiconductor device of claim 2, wherein:
the bulk metal component has a third horizontal dimension measured along the first axis and a fourth horizontal dimension measured along the second axis;
the third dimension is within a few percentage points from the first dimension; and
the fourth dimension is multiple times greater than the second dimension.

5. The semiconductor device of claim 1, wherein the metal via slots have a slot density in a range from about 50% to about 100%.

6. The semiconductor device of claim 5, wherein adjacent metal via slots are separated by dielectric materials, and wherein the slot density is defined by a ratio of: a horizontal dimension of one of the metal via slots to a horizontal dimension of the dielectric material disposed adjacent thereto.

7. The semiconductor device of claim 1, wherein the interconnect structure is a test structure.

8. The semiconductor device of claim 7, wherein the interconnect structure is implemented over a scribe-line region of the substrate.

9. The semiconductor device of claim 1, wherein the interconnect layer in which the metal via slots and the bulk metal component are located is disposed between another interconnect layer and a layer of the semiconductor device.

10. A semiconductor structure, comprising:
a first interconnect layer including a plurality of first devices over a semiconductor substrate;
a second interconnect layer located over the first interconnect layer, the second interconnect layer including a plurality of elongate via slots and a bulk component located over the plurality of via slots, wherein the via slots and the bulk component each contain a light-reflective material, and wherein each via has a first horizontal dimension and a second horizontal dimension measured in a different direction than the first horizontal dimension and substantially smaller than the first horizontal dimension, wherein the bulk component has a bottom surface facing the plurality of elongate via slots and an opposing top surface facing away from the plurality of elongate via slots;
a third interconnect layer located over the second interconnect layer, the third interconnect layer including a plurality of second devices, wherein the second devices include metal trenches, wherein the metal trenches are disposed directly over the bulk component and electrically isolated from the bulk component, wherein the second devices are electrically isolated from the semiconductor substrate, wherein the metal trenches include a first metal trench having a bottom surface facing the top surface of the bulk component; and
a dielectric material layer electrically isolating the metal trenches from the bulk component, wherein the dielectric material layer extends from the bottom surface of the first metal trench to the top surface of the bulk component.

11. The semiconductor structure of claim 10, wherein:
the via slots and the bulk component each contain metal and are interconnected together;
the first dimension is perpendicular to the second dimension;
the second dimension is at least several times smaller than the first dimension; and
a dimension of the bulk component measured in the same direction as the second dimension is at least multiple times greater than the second dimension of each of the via slots.

12. The semiconductor structure of claim 10, wherein:
via slots are separated from adjacent via slots by a dielectric material; and
a via slot density being defined by a ratio of a size of the via slots and the dielectric material is in a range from about 50% to about 100%.

13. The semiconductor structure of claim 10, wherein the first devices include dummy patterns.

14. The semiconductor structure of claim 10, wherein:
the semiconductor structure is a test structure; and
the first, second, and third interconnect layers are portions of an interconnect structure within the test structure.

15. The semiconductor structure of claim 14, the test structure is located in a scribe-line region of a wafer.

16. A method of fabricating a semiconductor device, comprising:
providing a wafer;
forming a first layer; and
forming an interconnect structure over the first layer, wherein the forming the interconnect structure includes:
forming a second interconnect layer over the first layer, the second interconnect layer containing: a plurality of metal via slots and a bulk metal component formed over the plurality of metal via slots; and
forming a third interconnect layer over the second interconnect layer, the third interconnect layer containing a metal trench; and
forming another interconnect structure over the wafer, wherein forming the another interconnect structure includes forming another metal trench; and
determining a depth of the another metal trench of the another interconnect structure by measuring a depth of the metal trench of the interconnect structure,
wherein forming the third interconnect layer over the second interconnect layer includes forming a dielectric material layer over the second interconnect layer, the dielectric material layer electrically isolating the metal trench from the bulk metal component, the bulk metal component having a bottom surface facing the plurality of metal via slots and an opposing top surface facing away from the plurality of metal via slots, the metal trench having a bottom surface facing the top surface of the bulk metal component, and the dielectric material layer extending from the bottom surface of the metal trench to the top surface of the bulk metal component.

17. The method of claim 16, wherein:
a horizontal surface of the wafer on which the interconnect structure is formed is defined by a first horizontal direction and a second horizontal direction;
each metal via slot has a first dimension defined in the first horizontal direction and a second dimension defined in the second horizontal direction;
the bulk metal component has a third dimension defined in the first horizontal direction and a fourth dimension defined in the second horizontal direction;
the first dimension is at least a plurality of times greater than the second dimension; and
the fourth dimension is at least a plurality of times greater than the second dimension.

18. The method of claim 16, further comprising performing an optical critical dimension (OCD) measurement process, including projecting a light on the wafer.

19. The semiconductor structure of claim 10, wherein the bulk component is electrically isolated from the semiconductor substrate.

20. The method of claim 16, wherein the bulk metal component covers the plurality of metal via slots.

* * * * *